United States Patent [19]

Hirai

[11] Patent Number: 5,384,286
[45] Date of Patent: Jan. 24, 1995

[54] PROCESS FOR ENCAPSULATING A SEMICONDUCTOR CHIP, LEADFRAME AND HEATSINK

[75] Inventor: Tatsuya Hirai, Itami, Japan

[73] Assignee: Mitsubishi Denki Kabushiki Kaisha, Tokyo, Japan

[21] Appl. No.: 928,285

[22] Filed: Aug. 12, 1992

[30] Foreign Application Priority Data

Aug. 16, 1991 [JP] Japan .................. 3-205885

[51] Int. Cl.⁶ .............. H01L 21/52; H01L 21/56; H01L 21/58; H01L 21/60
[52] U.S. Cl. .................. 437/207; 437/214; 437/217; 264/272.17; 257/675; 257/717; 257/796
[58] Field of Search .............. 437/207, 902, 214, 217; 264/272.17; 257/675, 717, 796

[56] References Cited

U.S. PATENT DOCUMENTS

| | | | |
|---|---|---|---|
| 3,659,821 | 5/1972 | Sakamoto et al. | 264/272.17 |
| 3,778,887 | 12/1973 | Suzuki et al. | 437/207 |
| 4,043,027 | 8/1977 | Birchler et al. | 264/272.17 |
| 4,680,617 | 7/1987 | Ross | 357/72 |

FOREIGN PATENT DOCUMENTS

| | | | |
|---|---|---|---|
| 2137249 | 5/1990 | Japan | 257/675 |
| 2163953 | 6/1990 | Japan | . |
| 445563 | 2/1992 | Japan | . |

*Primary Examiner*—Olik Chaudhuri
*Assistant Examiner*—David E. Graybiu
*Attorney, Agent, or Firm*—Leydig, Voit & Mayer

[57] ABSTRACT

A method mold for producing a semiconductor device having a heat-sinking plate and a leadframe. The heat-sinking frame and leadframe are precisely positioned on a lower mold with cooperating positioning holes and pins with a space between the heat-sinking frame and the leadframe. After an upper mold is clamped to the lower mold, resin is injected into a cavity in the mold to encapsulate the leadframe to which a semiconductor chip is attached and the heat-sinking plate into one body.

7 Claims, 4 Drawing Sheets

PROCESS FOR ENCAPSULATING A SEMICONDUCTOR CHIP, LEADFRAME AND HEATSINK

BACKGROUND OF THE INVENTION

1. Field of the Invention

The present invention relates to a method and an apparatus for producing a semiconductor device having a heat-sinking plate as well as a semiconductor chip which is encapsulated with a plastic material.

2. Description of the Prior Art

FIG. 4 is a cross sectional view of a conventional semiconductor device having a heat-sinking plate. In this figure, leadframe 2 has a die pad 2a on which a semiconductor chip 1 is attached, inner leads 2b extending into a plastic package material 4 and outer leads 2c extending to the outside from the plastic package material 4. Here, an inner lead 2b and an outer lead 2c form one continuous lead. Inner leads 2b are connected to pads (not shown in the figure) on the chip 1 with fine metal wires 3. The semiconductor chip 1, fine metal wires 3, the die pad 2a, inner leads 2b and the heat-sinking plate 16 are encapsulated into one body with a plastic package material 4.

FIG. 5 is a exploded perspective view for explanation of a conventional method of producing a semiconductor device. In this figure, a mold 11 comprises a lower mold 12 and an upper mold 13. The lower mold 12 has a cavity 12a and positioning pins 12b in each of three corners. Each of these positioning pins 12b is inserted into a respective hole in supporters 16a of the heat-sinking plate 16 so that the heat-sinking plate 16 is correctly positioned. The upper mold 13 has a cavity 13a and three receiving holes. When the upper mold 13 and the lower mold 12 are together the cavities 12a and 13b form a space in which a leadframe 2 with a chip 1 mounted on it and a heat-sinking plate 16 are put. Plastic resin is injected into this space. The receiving holes 13b in the upper mold 13 receive the positioning pins 12b when the molds are clamped together. The heat-sinking plate 16 has pre-bent portions 16b so that there is a gap between the heat-sinking plate 16 and the leadframe 2.

Referring to the figure, a conventional method for manufacturing semiconductor devices is described next. In the first step, a semiconductor chip 1 is attached on a die pad 2a of a leadframe 2. Then pads (not shown in the figure) on the chip 1 are connected to inner leads 2b of the leadframe 2 with fine metal wires 3. The positioning pins 12b are inserted into the holes in the supporters 16a so that the heat-sinking plate 16 is fixed on the lower mold 12 at the correct position. After the leadframe 2 is put on the heat-sinking plate 16, the upper mold 13 and the lower mold 12 are clamped together. Then plastic resin (not shown in the figure) is injected into the space in which the leadframe 2 and the heat-sinking plate 16 are put. Thus the leadframe with a chip and the heat-sinking plate are encapsulated with plastic resin. Next, unnecessary portions of the leadframe 2 and of the heat-sinking plate 16 are cut away. Finally, the outer lead 2c is formed into a proper shape to produce the completed semiconductor devices shown in FIG. 4.

In the conventional method for manufacturing semiconductor devices having a structure as described above, each heat-sinking plate is put on the lower mold one individually in a troublesome positioning process which results in poor productivity. Moreover, because the heat-sinking plate is bent partly, handling it at bent portions 16b causes further unnecessary bending at the portion 16a affecting positioning. This results in the error in positioning of the heat-sinking plate.

SUMMARY OF THE INVENTION

It is an object of the present invention to solve the problems described above. More specifically, it is an object of this invention to provide a method and an apparatus for improving productivity in the process of setting heat-sinking plates and for improving the accuracy in positioning heat-sinking plates.

In order to achieve the objects above, this invention provides a method for manufacturing a semiconductor device in which: a leadframe comprising plural parts connected to each other and a flat heat-sinking frame having plural heat-sinking plates connected to each other are put on a lower mold in such a way that said each part of said leadframe is positioned correctly on said each corresponding heat-sinking plate with a gap therebetween; an upper mold is put on the lower mold and they are clamped together and resin is injected around each semiconductor chip in the mold to encapsulate the semiconductor chip and the heat-sinking plate into one body.

To achieve the above objects, this invention further provides a mold which has a lower mold having a step to support a leadframe and a heat-sinking frame in such a way that each unit part of the leadframe including a semiconductor chip is positioned correctly on each corresponding heat-sinking plate with a gap therebetween.

In the method of this invention, plural heat-sinking plates are connected to each other to form a heat-sinking frame similar to a leadframe, and this heat-sinking frame is correctly positioned on the lower mold as a leadframe.

Moreover, the mold of this invention provides a means for putting a leadframe and a heat-sinking frame on the lower mold in such a way that each part of the leadframe is positioned correctly on the corresponding heat-sinking plate with a gap therebetween.

DESCRIPTION OF THE PREFERRED EMBODIMENTS

On the following pages, referring to figures, preferred embodiments are described.

Figure 1:
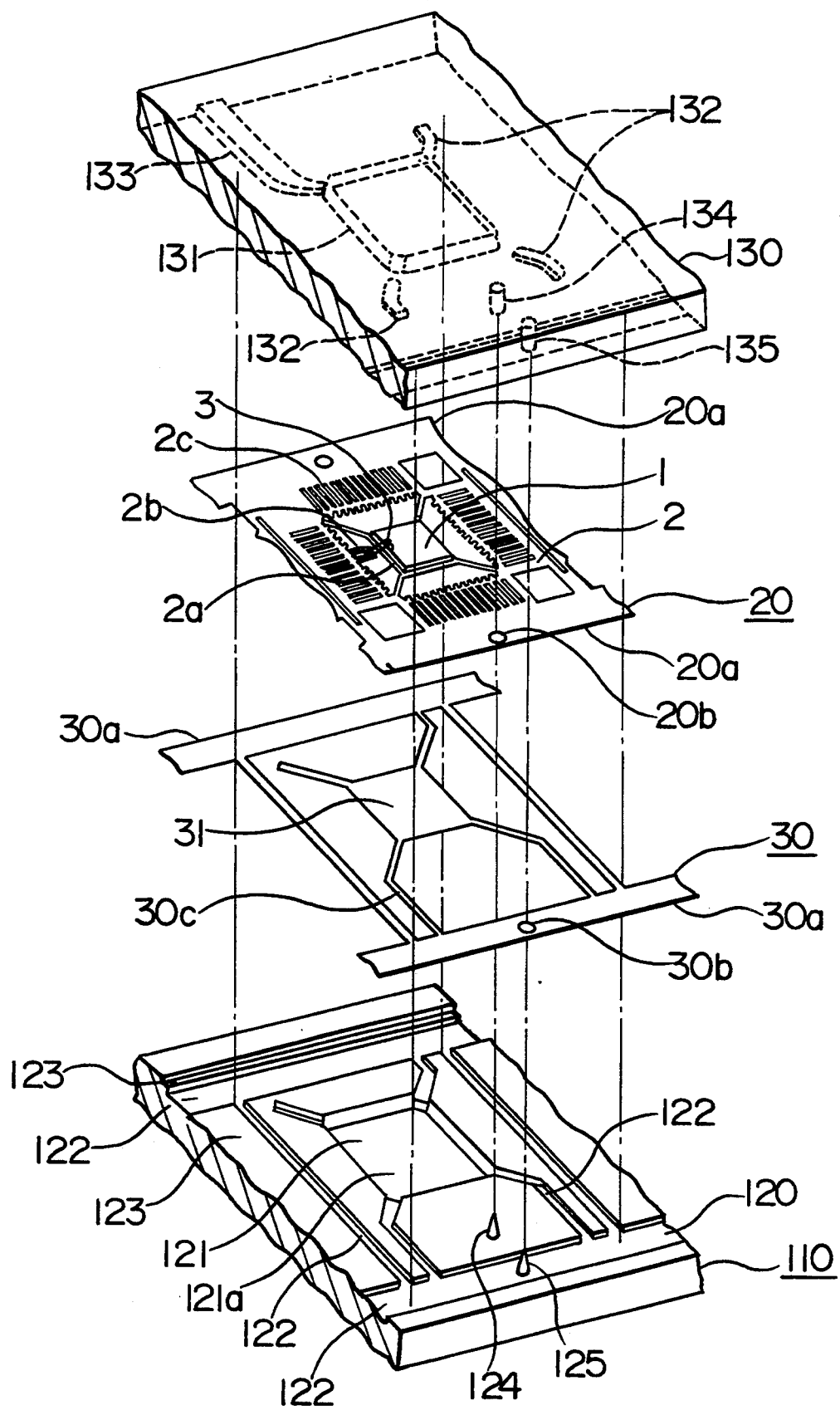
FIG. 1 is a exploded perspective view of a mold which is used for producing a semiconductor device by a method embodying this invention.
Figure 2:
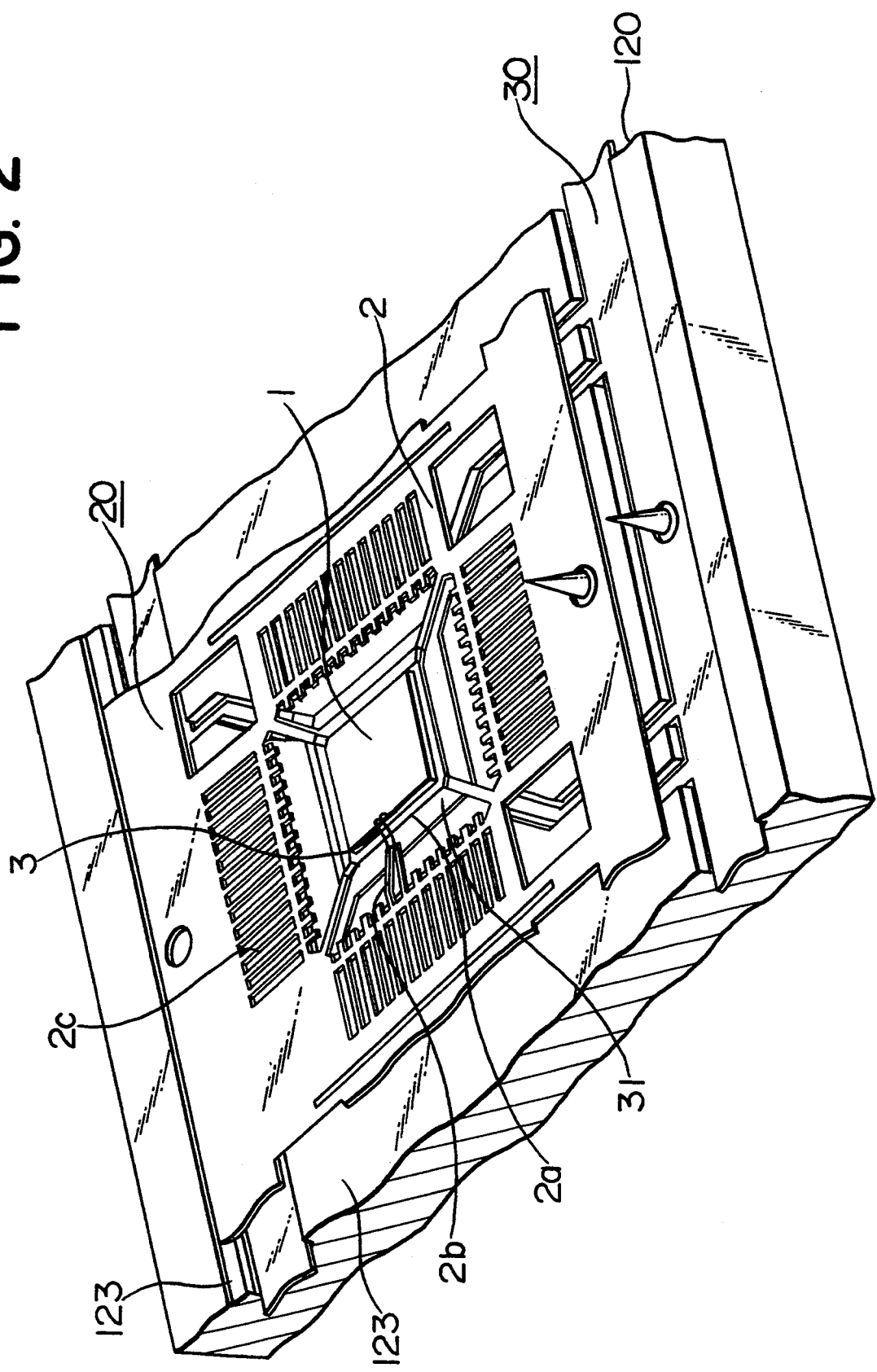
FIG. 2 is a perspective view showing a leadframe and a heat-sinking frame are positioned correctly on the lower mold of FIG. 1
Figure 3:
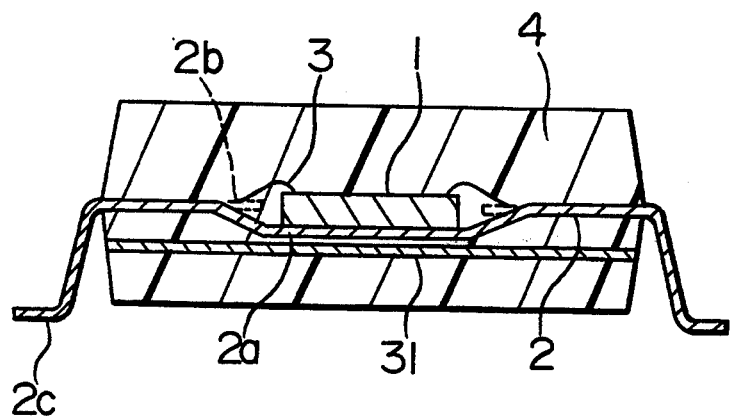
FIG. 3 is a cross sectional view of a semiconductor device with a heat-sinking plate produced by the method of this invention.

FIG. 1 is a exploded perspective view of a mold for manufacturing a semiconductor device according to the present invention. FIG. 2 is a perspective view showing a leadframe and a heat-sinking frame on the lower mold of FIG. 1 at correct positions. FIG. 3 is a cross sectional view of a semiconductor device manufactured by a method according to the present invention.

Figure 4:
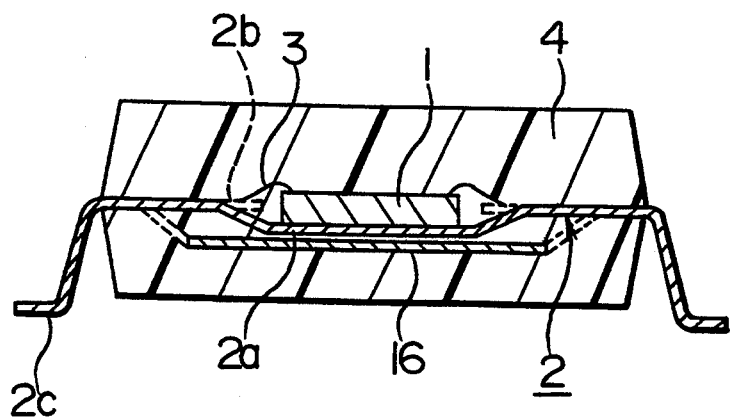
FIG. 4 is a cross sectional view of a conventional semiconductor device with a heat-sinking plate.
Figure 5:
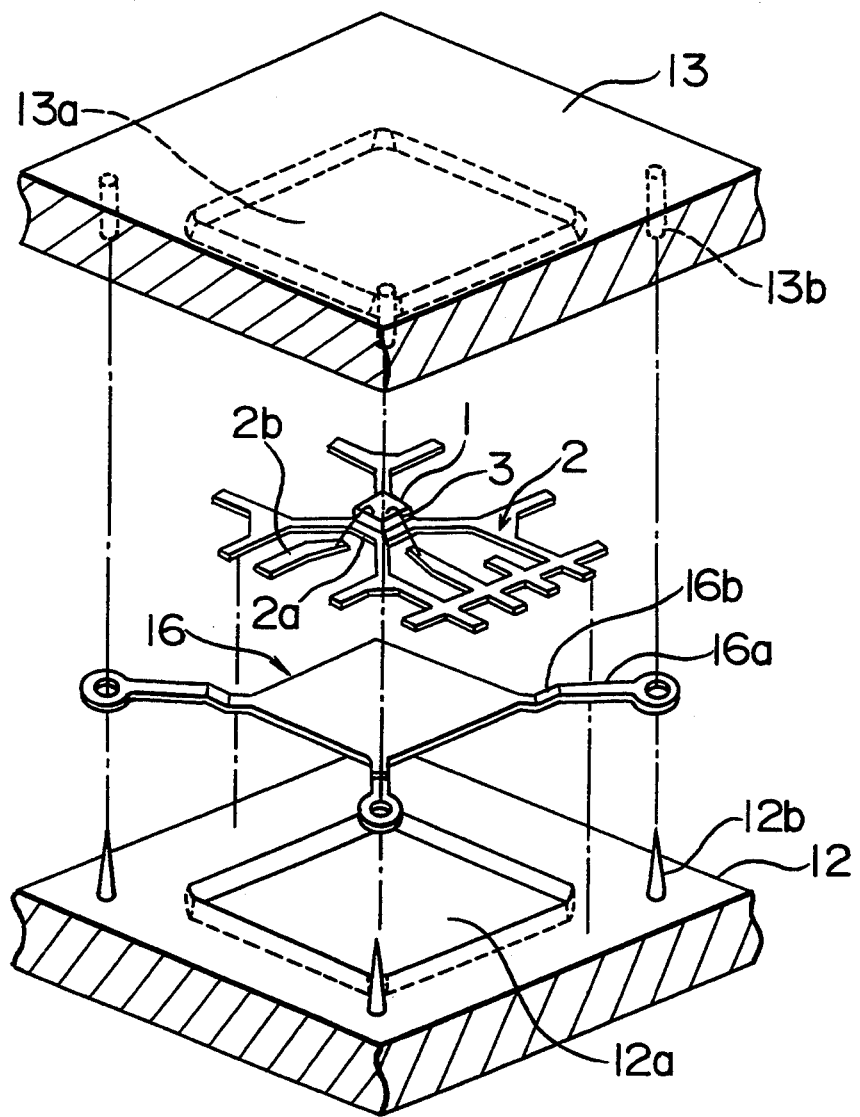
FIG. 5 is a perspective view for explanation of a conventional method for producing a semiconductor device.

In these figures, parts which are equivalent to or correspond to the parts in FIGS. 4 and 5 are denoted by the same numbers as those in FIG. 4 or 5 and the explanations of them are not repeated here. In FIG. 1, a leadframe 20 comprises plural parts 2 connected to each other with rails 20a at both sides of the parts. Similarly, a heat-sinking frame 30 comprises plural heat-sinking plates 31 connected to each other with supporting rails 30a at both sides of the heat-sinking frame 30 and coplanar with the plates 31. In FIGS. 1 and 2, only one unit 2 of a leadframe and of the heat-sinking plate 31 are shown.

A mold 110 comprises a lower mold 120 and an upper mold 130. In the figure, only each one unit of the lower mold and one unit of the upper mold are shown but in practice there exist the same number of the lower molds 120 and the upper molds 130 connected to each other as the number of the heat-sinking plates 31 or the units of the frame 2. The upper mold 130 and the lower mold 120 have the same pitch between each unit as that between each connected heat-sinking plate or that between each unit part of a leadframe. Therefore, a plural predetermined number of semiconductor chips and heat-sinking plates are encapsulated with plastic resin in one process.

The following description explains of a mold comprising a unit of an upper mold 130 and a unit of a lower mold 120. When the lower mold 120 is clamped to the upper mold 130, the cavity 121 in the lower mold 120, in conjunction with the cavity 131 in the upper mold 130, forms a space in which a die pad 2a and its surrounding materials of a unit part 2 of a leadframe and a heat-sinking plate 31 are put. Grooves 122 are formed so that rails 30a and suspenders 30c of a heat-sinking frame 30 are fit into those grooves 122. A supporting surface 123 supports a unit part 2 of a leadframe (See FIG. 2). The levels of the base 121a of the cavity 121, grooves 122, and the supporting surface 123 are different from each other, in other words they form three steps, so that there exists a gap between the heat-sinking plate 31 and of the leadframe and so all of the heat-sinking plate is covered with encapsulating plastic resin. The positioning pin 124 is inserted into the positioning hole 20b in the rail 20a of the leadframe 20 so that the leadframe 20 is positioned correctly. The positioning pin 125 is inserted into the positioning hole 30b in the rail 30a of the heat-sinking frame 30 so that the frame 30 is positioned correctly.

On the other hand, the upper mold 130 has receiving holes 134 and 135 which receive the positioning pins 124 and 125 of the lower mold 120 when the upper mold 130 is clamped to the lower mold 120, an injection groove 133 through which plastic resin (not shown in the figure) is injected into the space formed be the cavities 121 and 131, and protrusions 132 which fill the grooves 122 of the lower mold 120 so that the injected plastic resin does not leak through the grooves 122.

Referring to the figures, the method of manufacturing a semiconductor device according this invention is described next. First, a semiconductor chip 1 is attached on each die pad 2a of a part 2 of a leadframe 20. Next, pads (not shown in the figure) on the chip 1 are connected to inner leads 2b of each part 2 of the leadframe with fine metal wires 3. Until this step, manufacturing is carried out with other machines, such as a wire bonder, by conventional methods.

Then, a heat-sinking frame 30 is put on the lower mold 120 in such a way that the positioning pin 125 and grooves 122 fit the heat-sinking frame so that the heat-sinking frame 30 is positioned correctly. There exists a step between the base of the groove 122 and the base 121a of the cavity 121, thus the heat-sinking plate 31 is spaced from the base 121a of the cavity 121 with an air gap under the heat-sinking plate 31. The heat-sinking frame 30 has a flat shape and when it is put on the lower mold, suspenders 30c are fitted into the grooves 122. Thus, there is no bent portion. Besides, the suspenders are protected by the grooves 122. As a result, there is little possibility that bending will occur at any portion of the heat-sinking frame.

Furthermore, a leadframe 20 is put on the supporting surface 123, positioned with a positioning pin 124 so that the die pad 2a is located approximately on the central part of the heat-sinking plate 31. There exists a step between the supporting surface 123 and the base of the grooves 122, thus the die pad 2a is spaced from the heat-sinking plate 31, i.e., there exists a gap between the die pad 2a and the heat-sinking plate 31. Therefore, there is no possibility that the leadframe 20 will contact the heat-sinking frame 30.

Next, an upper mold 130 is put on and clamped to the lower mold 120. In this condition, the heat-sinking plate 31, the semiconductor chip 1, the die pad 2a, the inner leads 2b, and the metal wires 3 are in the space formed by the cavity 131 of the upper mold 130 and the cavity 121 of the lower mold 120. Then, plastic resin (not shown in the figure) is injected into the space described above through the injecting groove 133 to encapsulate all the members described above in the cavity with the resin. In this step, the resin smoothly fills the entire space including the gap between the base 121a of the cavity 121 and the heat-sinking plate 31 and the gap between the heat-sinking plate 31 and the die pad 2a. Thus, the molded plastic resin 4 is formed as shown in FIG. 3.

Finally, each semiconductor device encapsulated with plastic resin is separated from like pieces by cutting the frame, then outer leads 2c are formed into a desirable shape to produce a completed plural semiconductor device as shown in FIG. 3.

In this semiconductor device, there exists a flat and large area heat-sinking plate 31 extending across the whole device. Because this heat-sinking plate has no bent portions, there is little possibility that bending occurs at portions of this heat-sinking plate during manufacturing process and it is possible to achieve accurate positioning. The large area of the heat-sinking plate results in high efficiency in cooling.

Furthermore, another feature of this invention is that a leadframe 20 and a heat-sinking plate 30 can be made of different metals without any problems. For example, when the leadframe 20 is made of iron or a related alloy and the heat-sinking plate 30 is made of copper or a related alloy, bending or distortion due to the difference between their thermal expansion coefficients does not occur because there is no contact between these two different kinds of metals. Besides, this structure avoids corrosion which might occur when different kinds of metals contact each other. Thus, high reliability semiconductor devices are produced.

As described above, this method of the present invention utilizes a heat-sinking frame having plural heat-sinking plates connected to rails in a way similar to a leadframe to improve productivity. Furthermore, this invention provides a semiconductor device with a heat-sinking plate having a larger size than that of conventional semiconductor devices, which is effective for cooling.

What is claimed is:

1. A method for producing a semiconductor device comprising:
    disposing a heat-sinking frame including supporting rails and a heat-sinking plate disposed between, coplanar with, and suspended from the supporting rails on a lower mold with the supporting rails being supported by the lower mold and with the heat-sinking plate spaced from the lower mold by a gap;
    disposing a leadframe having a die pad and a semiconductor chip mounted on the die pad on the lower mold with a gap between each part of the leadframe and the heat-sinking frame;
    clamping an upper mold to the lower mold; and
    injecting plastic resin between the clamped upper and lower molds and around the semiconductor chip within the clamped upper and lower molds to form molded plastic resin encapsulating the semiconductor chip, a portion of the leadframe, and the heat-sinking plate in one body.

2. The method for producing a semiconductor device defined in claim 1 including supporting the leadframe on a supporting surface of the lower mold, placing the heat-sinking frame into grooves in the supporting surface shaped to receive the heat-sinking frame, and injecting plastic resin into a space between the heat-sinking plate and a base surface penetrating into the lower mold deeper than the grooves and the supporting surface.

3. The method for producing a semiconductor device defined in claim 1 including positioning the leadframe and the heat-sinking frame with positioning holes in the leadframe and the heat-sinking frame engaging positioning pins on the lower mold.

4. The method for producing a semiconductor device defined in claim 1 including injecting the plastic resin in the gap between the leadframe and the heat-sinking plate.

5. The method for producing a semiconductor device defined in claim 1 including injecting the plastic resin in the gap between the heat-sinking plate and the lower mold.

6. The method for producing a semiconductor device defined in claim 1 including supporting the heat-sinking plate between the upper and lower molds with suspenders extending between the heat-sinking plate and the supporting rails of the heat-sinking frame.

7. The method for producing a semiconductor device defined in claim 1 wherein the heat-sinking frame comprises a plurality of heat-sinking plates connected between the supporting rails, the method including simultaneously placing the heat-sinking plates in a plurality of different cavities in the lower mold.

* * * * *